(12) United States Patent
Tsang et al.

(10) Patent No.: US 6,326,261 B1
(45) Date of Patent: Dec. 4, 2001

(54) METHOD OF FABRICATING A DEEP TRENCH CAPACITOR

(75) Inventors: Ling-Hsu Tsang; De-Yuan Wu, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/754,345

(22) Filed: Jan. 5, 2001

(51) Int. Cl.[7] .................................................. H01L 21/8242
(52) U.S. Cl. ........................ 438/243; 438/244; 438/248; 438/249; 438/386
(58) Field of Search .................................... 438/239, 243, 438/244, 245, 248, 369, 256, 286, 387, 391, 392

(56) References Cited

U.S. PATENT DOCUMENTS 6,117,726 * 9/2000 Tsai et al. .............................. 438/242
6,281,069 * 8/2001 Wu et al. ............................... 438/248

* cited by examiner

Primary Examiner—Charles Bowers
Assistant Examiner—Jack Chen
(74) Attorney, Agent, or Firm—Winston Hsu

(57) ABSTRACT

A method of fabricating a deep trench capacitor is achieved. A deep trench is formed in a silicon substrate followed by the formation of a buried plate in the silicon substrate beneath the deep trench. A silicon nitride layer is formed on the surface of the deep trench above the buried plate. An oxidation process is performed to simultaneously form a first oxide film on the silicon nitride layer and a second oxide film on the silicon substrate within the deep trench. A doped polysilicon layer is formed in the deep trench with its surface lowered down to the surface of the substrate. Finally, a portion of the second oxide film is removed to expose the substrate in the upper region of the deep trench followed by the filling in of an undoped polysilicon layer into the deep trench to finish the fabrication process of the DRAM deep trench capacitor.

18 Claims, 8 Drawing Sheets

METHOD OF FABRICATING A DEEP TRENCH CAPACITOR

BACKGROUND OF THE INVENTION

1. Field of the Invention

The present invention relates to a method of fabricating a capacitor of a dynamic random access memory (DRAM) cell, and more particularly, to a method of fabricating a deep trench capacitor.

2. Description of the Prior Art

A memory cell of a DRAM is composed of a metal oxide semiconductor (MOS) transistor connected to a capacitor. The MOS transistor comprises a gate, and a first and second doped region. The two doped regions are identical in structure and are used as a source or a drain depending on the operational situation of the MOS transistor. The MOS transistor functions by using the gate electrically connected to a word line as a switch, using the source electrically connected to a bit line as a current transporting path, and using the drain electrically connected to a storage node of the capacitor to complete data accessing.

The capacitor, composed of a top electrode, a capacitor dielectric layer and a storage node, is formed on a silicon oxide layer over a substrate. In a present DRAM process, the capacitor is designed as either a stack capacitor stacked on the substrate or a deep trench capacitor buried within the substrate.

Please refer to FIG. 1 to FIG. 6. FIG. 1 to FIG. 6 are schematic diagrams of a method of fabricating a DRAM deep trench capacitor. As shown in FIG. 1, a pad stack 14 composed of a silicon nitride layer and a pad oxide layer is formed on a substrate 12 of a semiconductor wafer 10. A photoresist layer (not shown) is formed on the surface of the pad stack 14. Next, a photolithographic process and etching process are performed to form an opening 16 in the pad stack 14 to define the position of the deep trench.

As shown in FIG. 2, an etching process is performed using the pad stack 14 as a mask to etch the opening 16 down to the substrate 12 to form a deep trench 18 with a depth of 7~7.5 micrometers ($\mu$m). Subsequently, an arsenic silicate glass (ASG) diffusion method is used to form a N-doped buried plate 20 as a top plate of the capacitor within the substrate 12 and beneath the deep trench 18.

As shown in FIG. 3, a chemical vapor deposition (CVD) process is performed to form a silicon nitride layer (not shown) on the surface of the deep trench 18. Next, a thermal oxidation process is performed to grow an oxide layer (not shown) on the silicon nitride layer, so that the silicon nitride layer together with the oxide layer form a capacitor dielectric layer 22. Next, a N-doped polysilicon layer 24 is deposited into and completely fills in the deep trench 18, to function as a primary conductor of the storage node. A planarization process, such as a chemical mechanical polishing or an etching back process, is performed using the pad stack 14 as a stop layer to remove portions of the doped polysilicon layer 24 and align its surface with the pad stack 14.

As shown in FIG. 4, a first polysilicon recess etching process is performed to etch the doped polysilicon layer 24 down to the surface of the substrate 12. A wet etching process is then performed, using phosphoric acid ($H_3PO_4$) as the etching solution, to remove half the depth of the capacitor dielectric layer 22 so as to expose the area of the substrate 12 in the upper region of the deep trench 18.

As shown in FIG. 5, another thermal oxidation process is performed to form a pair of collar oxides 26, with a thickness of 200~300 angstroms (Å), on the exposed substrate 12 in the upper region of the deep trench 18. A N-doped polysilicon layer 27 is deposited on the surface of the semiconductor wafer 10 and fills in the deep trench 18, followed by a planarization process to remove portions of the doped polysilicon layer 27 and approximately align the surface of the doped polysilicon layer 27 with that of the pad stack 14. A second polysilicon recess etching process is performed to etch back portions of the doped polysilicon layer 27 and lower the surface of the remaining doped polysilicon layer 27 down to the surface of the collar oxides 26.

As shown in FIG. 6, an etching process is performed to remove portions of the collar oxides 26 so as to expose the substrate 12 in the deep trench 18. A CVD process is then performed to deposit an undoped polysilicon layer 28 on the semiconductor wafer 10. Next, a planarization process is performed using the pad stack 14 as a stop layer to remove portions of the undoped polysilicon layer 28 and approximately align the surface of the remaining undoped polysilicon layer 28 with that of the pad stack 14. A third polysilicon recess etching process is performed to etch back the undoped polysilicon layer 28 and lower its surface down to the pad stack 14. Finally, the pad stack 14 is completely removed to finish the fabrication of the storage node.

In the prior method, a phase-in polysilicon filling is used to fabricate the storage node, which requires a three-time repeated operational cycle of deposition, planarization and recess etching processes. Thus, it not only complicates the fabrication process but also increases both production cost and time.

SUMMARY OF THE INVENTION

It is therefore an objective of the present invention to provide a method of fabricating a deep trench capacitor to simplify the production process.

In a preferred embodiment, the present invention provides a method of fabricating a deep trench capacitor. Firstly, a deep trench is formed in a silicon substrate. Then, a buried plate is formed in the silicon substrate beneath the deep trench. A silicon nitride layer is then formed on the surface of the deep trench above the buried plate. An oxidation process is performed to simultaneously form a first oxide film on the silicon nitride layer and a second oxide film on the silicon substrate within the deep trench. A doped polysilicon layer is formed in the deep trench with a lower surface down to the surface of the substrate. Finally, a portion of the second oxide film is removed to expose the substrate in the upper region of the deep trench, followed by the filling in of an undoped polysilicon layer into the deep trench to finish the fabrication process of the capacitor.

It is an advantage of the present invention that a first oxide film on the silicon nitride layer, and a second oxide film on the exposed substrate in the upper region of the deep trench are simultaneously formed. The first oxide film combines with the silicon nitride layer to form a silicon nitride-oxide (NO) capacitor dielectric layer while the second oxide film functions as a collar oxide film. Then, a polysilicon layer is deposited to fill in the deep trench to complete the capacitor structure. The present invention does not require the phase-in polysilicon filling process of the prior method used prior to and proceeding the formation of the collar oxide layer, which simplifies the fabrication of the deep trench capacitor.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
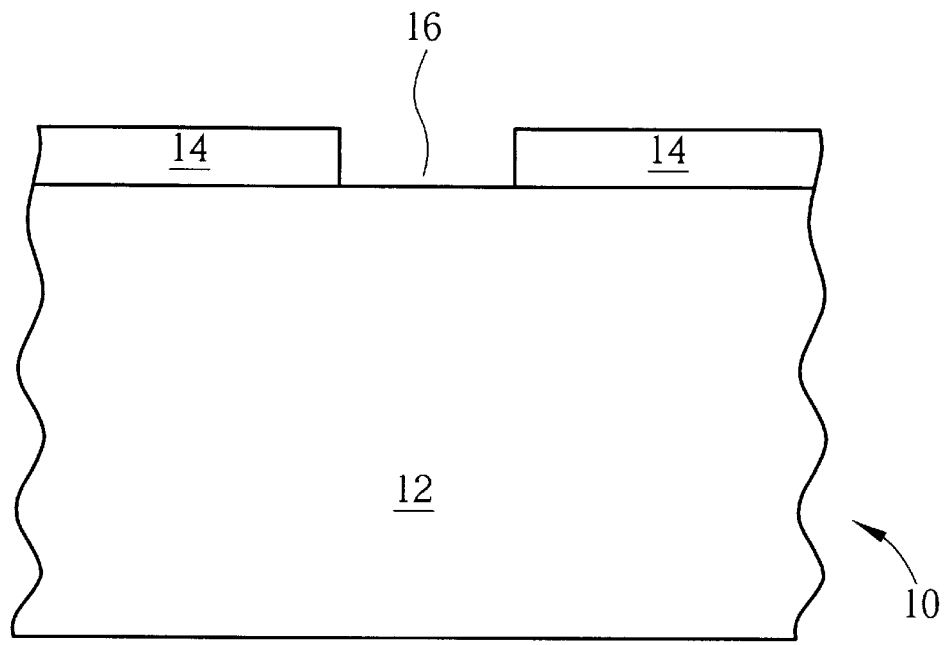
FIG. 1 to FIG. 6 are schematic diagrams of a prior art method of fabricating a DRAM deep trench capacitor.
Figure 2:
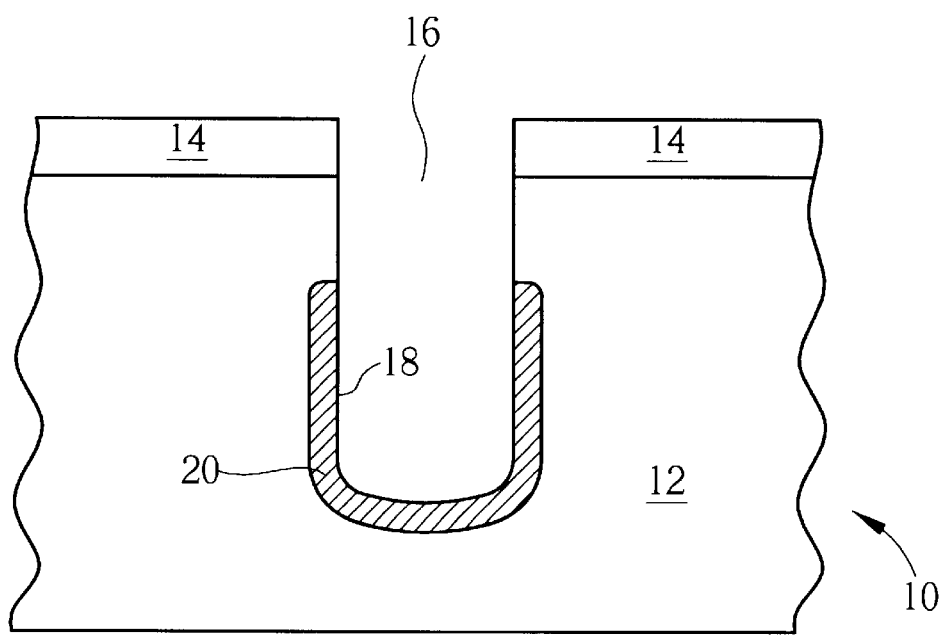
Figure 3:
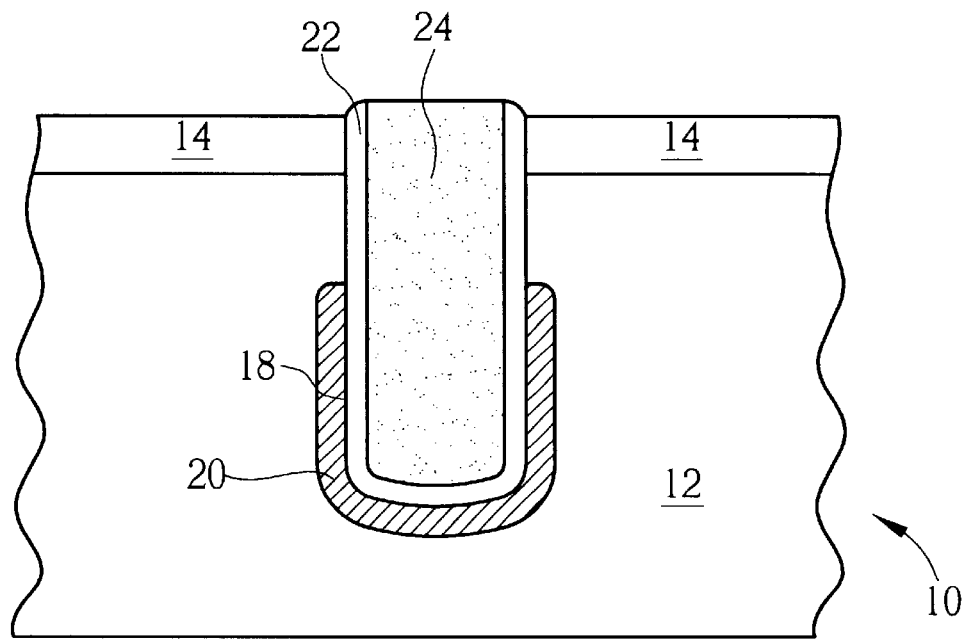
Figure 4:
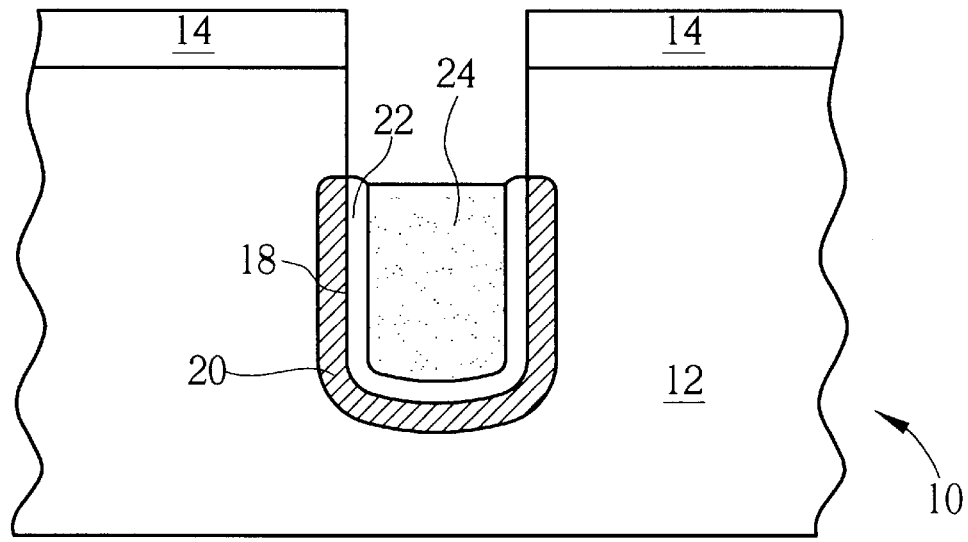
Figure 5:
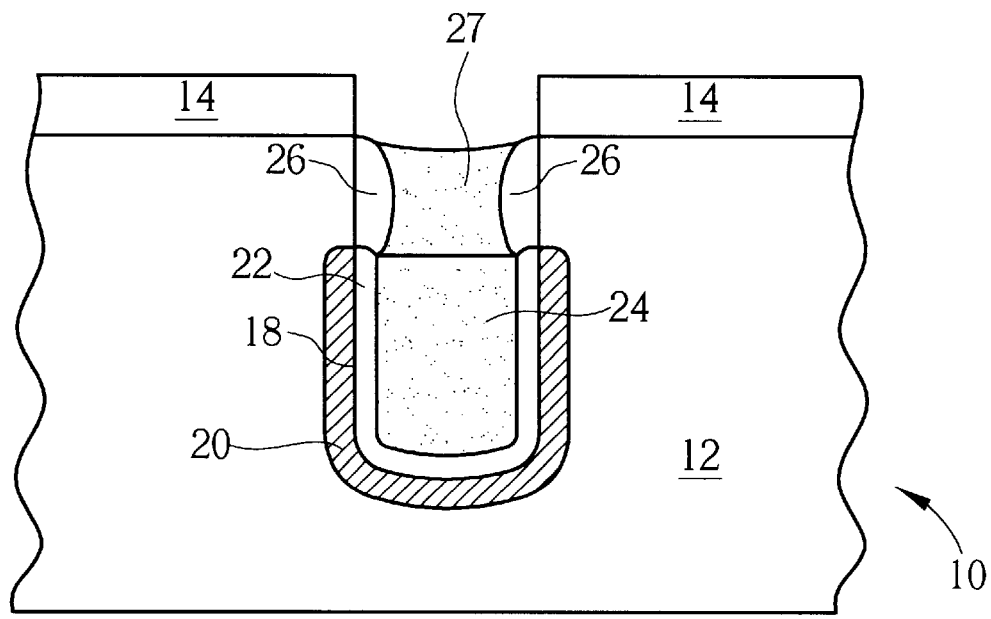
Figure 6:
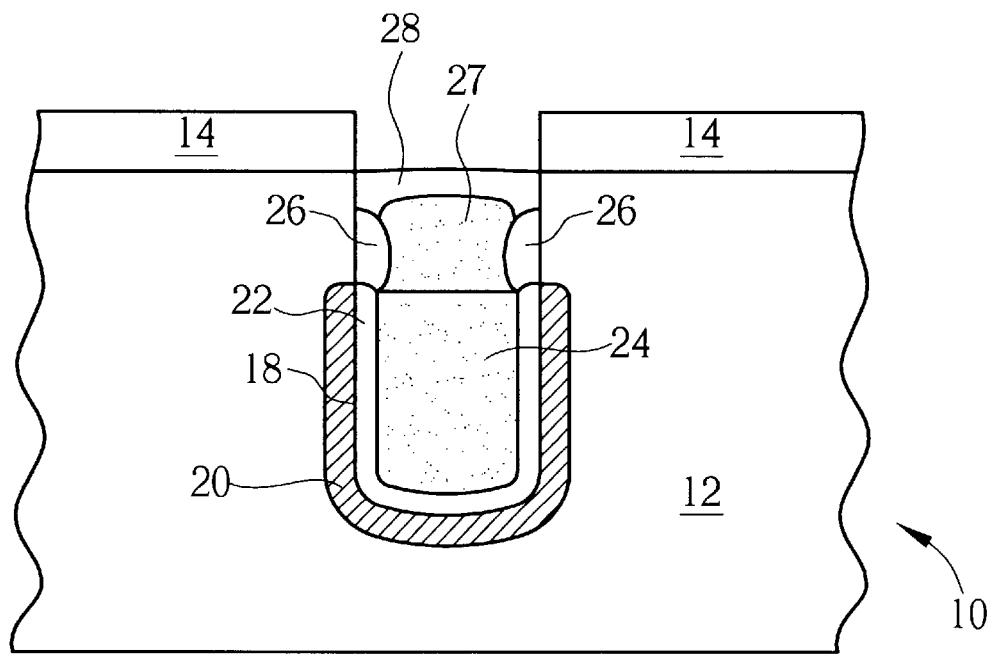
Figure 7:
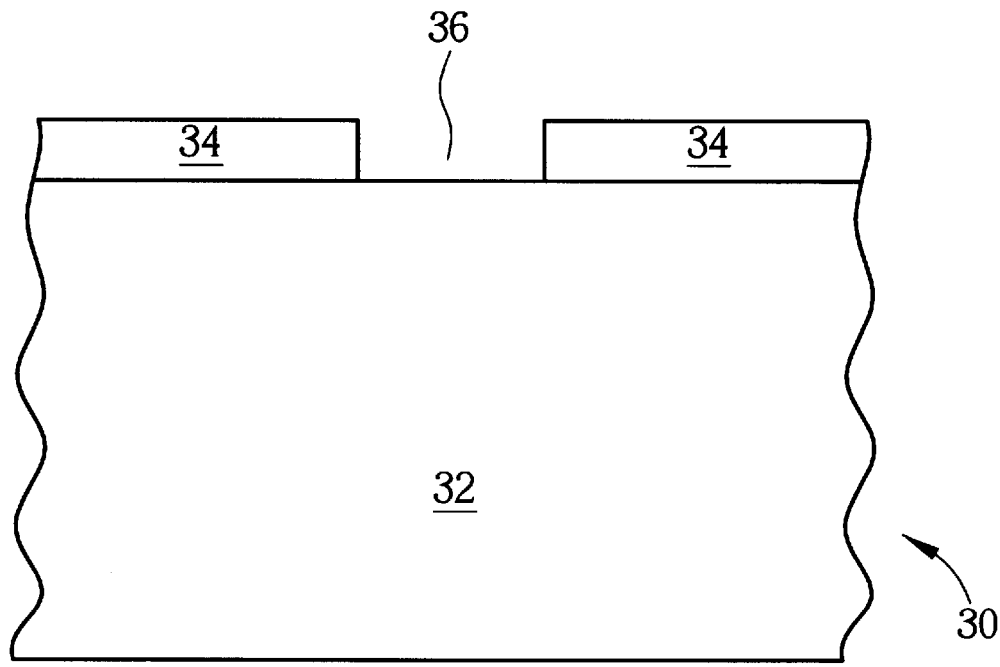
FIG. 7 to FIG. 16 are schematic diagrams of a method of fabricating a DRAM deep trench capacitor according to the present invention.

Please refer to FIG. 7 to FIG. 16. FIG. 7 to FIG. 16 are schematic diagrams of a method of fabricating a DRAM deep trench capacitor on a semiconductor wafer 30 according to the present invention. As shown in FIG. 7, the present invention method forms a pad stack 34 on the surface of a substrate 32, the pad stack 34 comprising an opening 36 connected to the surface of the substrate 32 to define the position and pattern of the deep trench capacitor. The method of forming the opening 36 is by use of photolithographic and etching processes known by those in the art and hence will not be mentioned further. In a preferred embodiment of the present invention, the pad stack 34 is formed of a stacked silicon nitride layer and a pad oxide layer (not shown), and the substrate 32 is formed of a silicon substrate, a silicon-on-insulator (SOI) substrate or an epitaxy silicon substrate.

Figure 8:
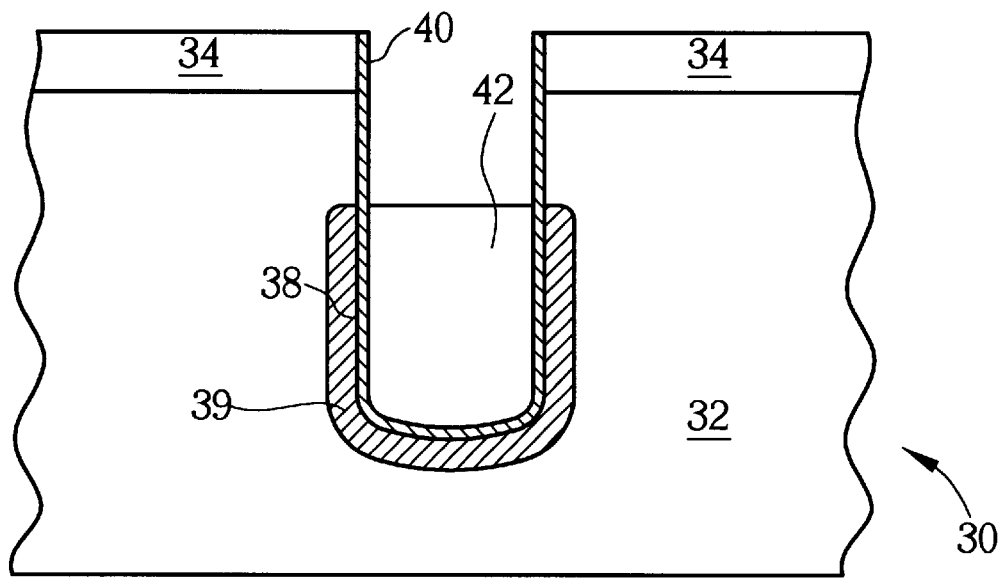

As shown in FIG. 8, an anisotropic reactive ion etching (RIE) process is performed using the pad stack 34 as an etching mask to etch the opening 36 down to the substrate 32 to form a deep trench 38 with a depth of between 7 to 7.5 micrometers. An arsenic silicate glass (ASG) is formed to fill in the deep trench 38, followed by an etching back process to remove a portion of the ASG within the deep trench 38 so that thickness of the remaining ASG, used as a dopant source, within the deep trench 38 is approximately 60% to 90% the depth of the deep trench 38. A thermal diffusion process with a temperature between 800 to 900° C. is then performed to diffuse the arsenic atoms, in the ASG layer remaining within the deep trench 38, into the substrate 32 contacting the ASG to form a buried diffused plate 39.

After the thermal diffusion process is finished, the ASG remaining within the deep trench 38 is removed. A silicon nitride layer 40 of a thickness between 100 to 300 angstroms is deposited on the substrate 32. Subsequently, a photoresist layer 42 fills in the deep trench 38, with the surface of the photoresist layer 42 aligned with the tops of the deep trench 38. Therein, the silicon nitride layer 40 uniformly covers both the surfaces of the pad stack 34 and the deep trench 38. The photoresist layer 42 is formed by spin coating the photoresist solution into the deep trench 38, and following the baking of the photoresist solution, an oxygen plasma is used to etch back the baked photoresist to form a photoresist layer 42 of an appropriate thickness.

Figure 9:
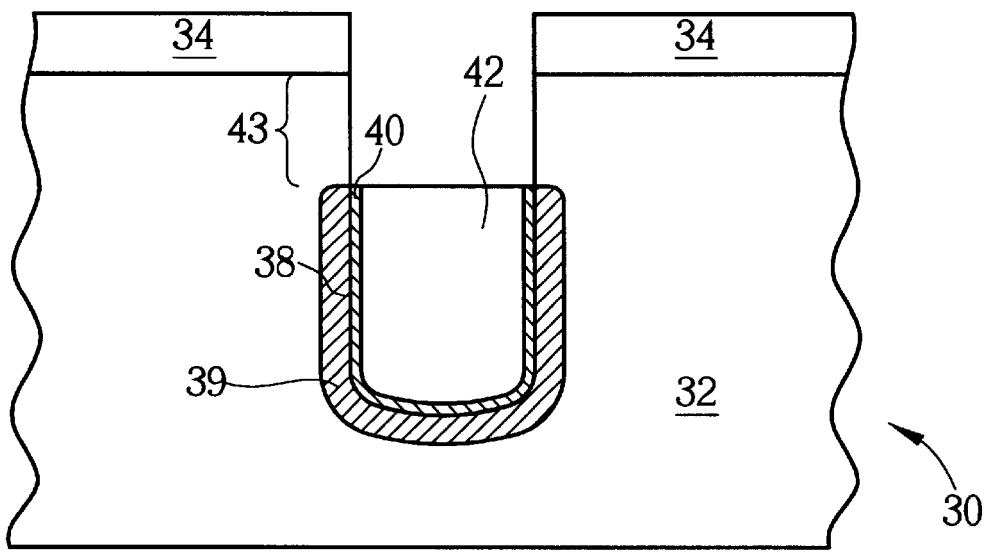
Figure 10:
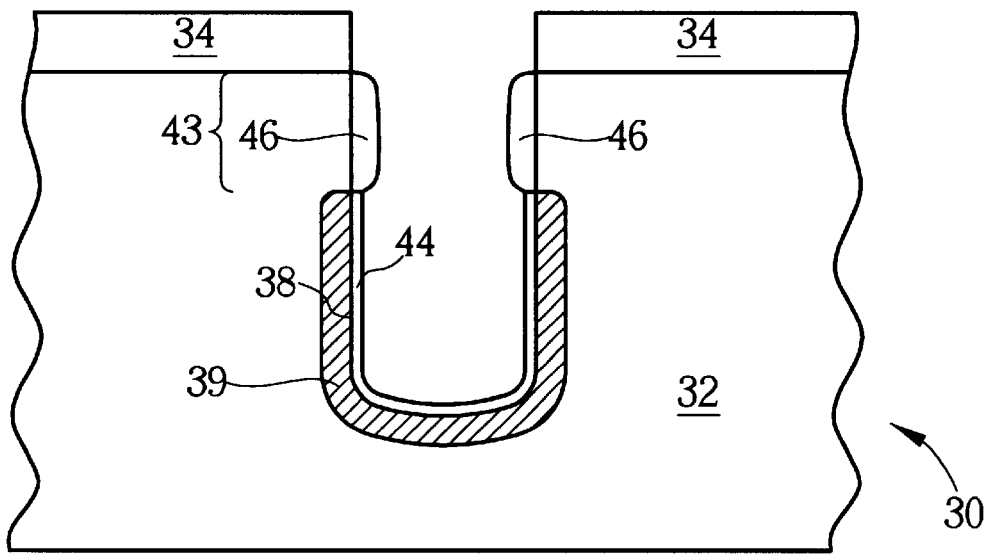

As shown in FIG. 9, a wet etching is performed, using phosphoric acid ($H_3PO_4$) for example, to remove the silicon nitride layer 40 not covered by the photoresist layer 42 and to expose the substrate 32 in the upper region of the deep trench 38. After the removal of the photoresist layer 42, as shown in FIG. 10, a high-temperature oxidation process, such as a rapid thermal process (RTP) operated under a 900~1000° C., moist environment, is performed to simultaneously grow a first oxide film (not shown) on the surface of the silicon nitride layer 40 and a second oxide film on the exposed substrate 32 in the upper region 43 of the deep trench 38.

Since the oxidation rate of oxygen on the silicon nitride layer 40 differs with that of the rate on the substrate 32, the growth rate of the first oxide film is faster than that of the second oxide film. Hence, the present invention can operate process parameters, such as reaction time, gas flow rate and reactor types, to achieve the predetermined thickness for the two oxide films. Therein, the first oxide film combines with the silicon nitride layer 40 to form a NO (nitride-oxide) capacitor dielectric layer 44 over the buried plate 39, while the second oxide film, also called a collar oxide 46, with a thickness between 200 to 300 angstroms is formed to reduce parasitic leakage from the deep trench 38.

Figure 11:
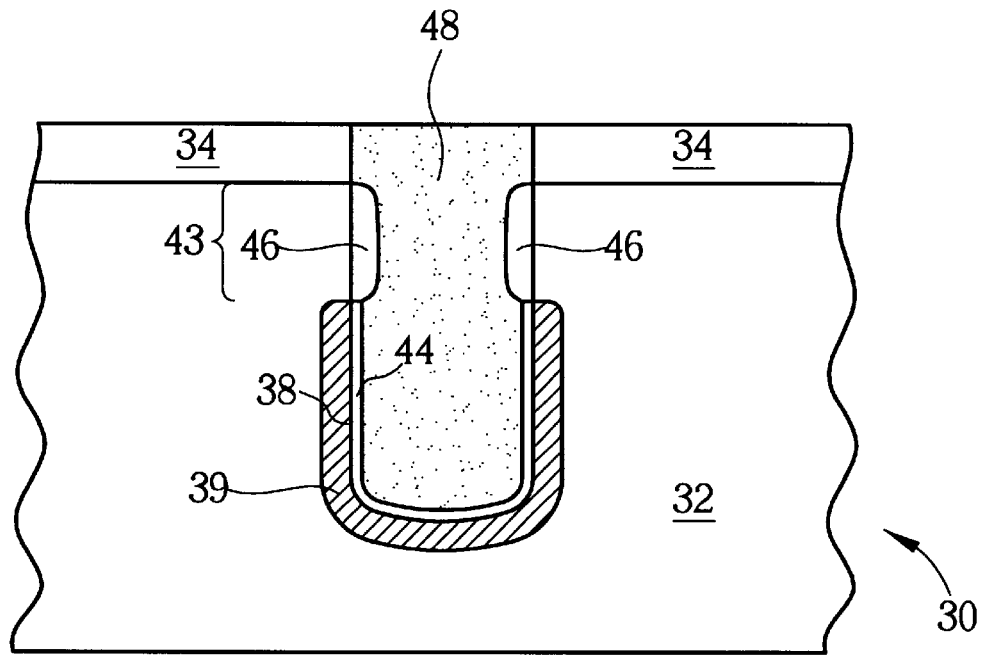

As shown in FIG. 11, a doped polysilicon layer 48 is deposited on the surface of the semiconductor wafer 30 to completely cover the deep trench 38. In a preferred embodiment of the present invention, the doped polysilicon layer 48 is a N-doped layer. Then, a first planarization process such as chemical mechanical polishing (CMP) is performed using the pad stack 34 as a polishing stop layer to remove a portion of the doped polysilicon layer 48 and align the surface of the remaining doped polysilicon layer 48 with that of the pad stack 34.

Figure 12:
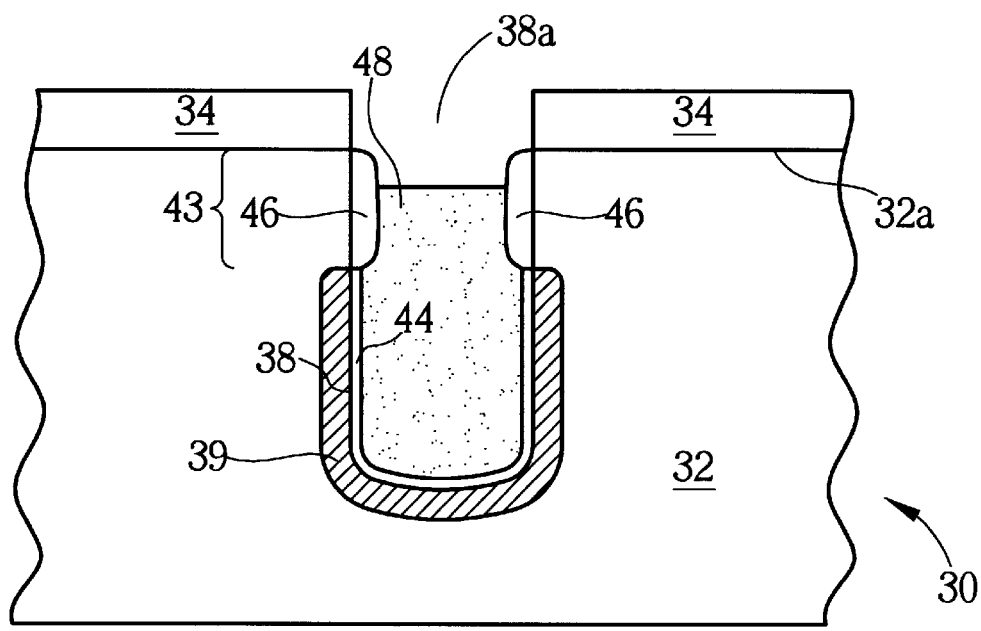
Figure 13:
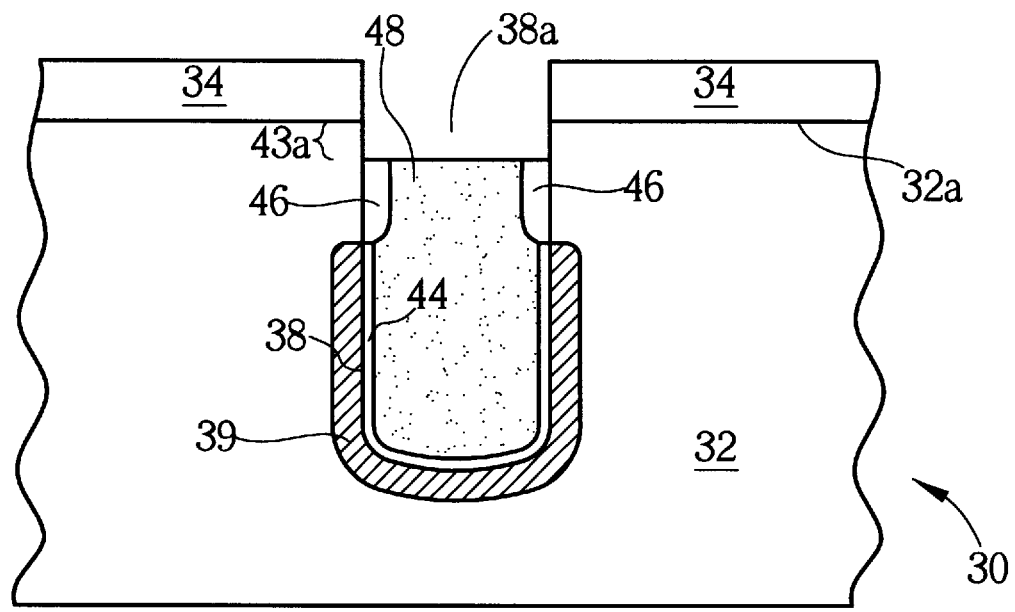

As shown in FIG. 12, a first polysilicon recess etching process such as RIE is performed to selectively remove a portion of the doped polysilicon layer 48 within the deep trench 38, to lower the surface of the remaining doped polysilicon layer 48 by a few hundred angstroms below the substrate surface 32a, and to form a recess 38a and expose a portion of the collar oxide 46. Next, as shown in FIG. 13, an etching process is performed using a buffered oxide etcher (BOE) or diluted hydrofluoric acid (DHF) to remove the exposed collar oxide 46 and to expose the substrate 32 in the upper region 43a of the deep trench 38.

Figure 14:
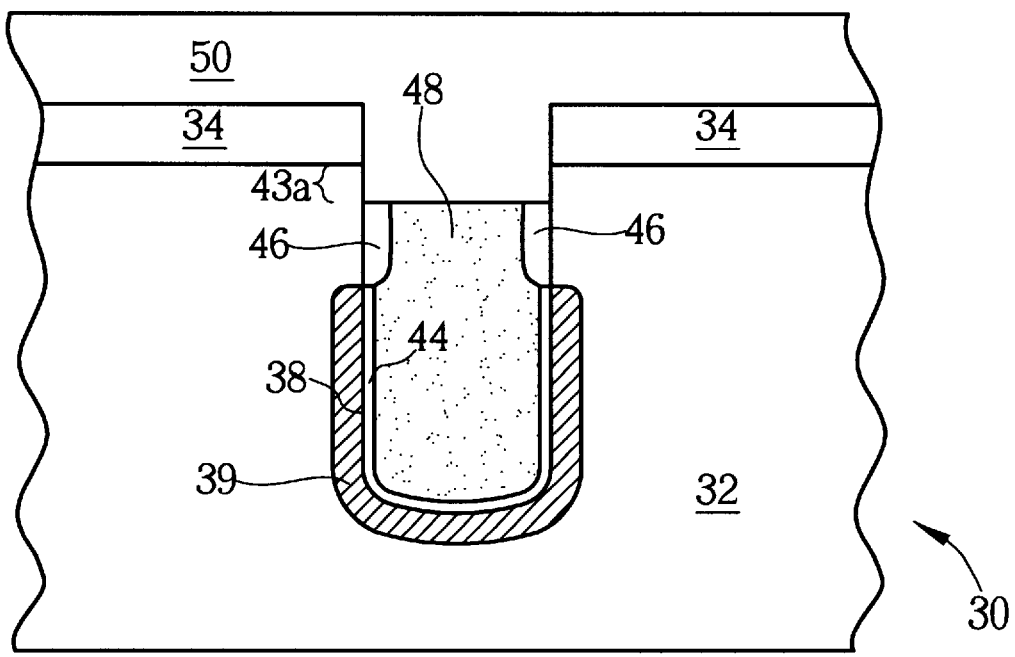
Figure 15:
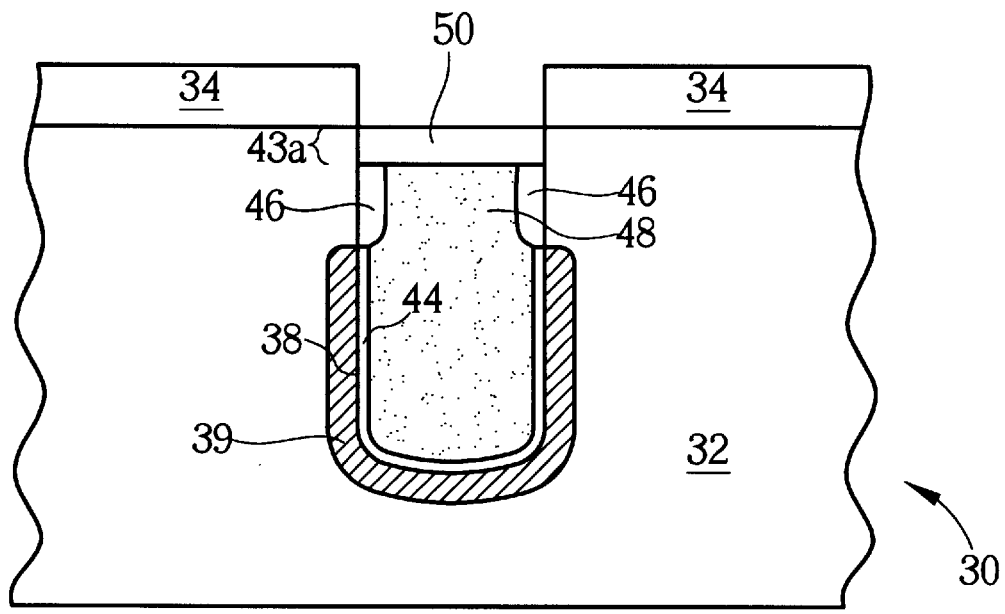

As shown in FIG. 14, a CVD process is performed to deposit an undoped polysilicon layer 50 on the surface of the semiconductor wafer 30 and to cover the recess 38a. Subsequently, as shown in FIG. 15, a second planarization process such as CMP is performed using the pad stack 34 as a stop layer to remove a portion of the undoped polysilicon layer 50 and to align the surface of the undoped polysilicon layer 50 with the surface of the pad stack 34. A second polysilicon recess etching process is also performed using RIE to etch back a portion of the undoped polysilicon layer 50, so that the surface of the remaining undoped polysilicon layer 50 is lowered down to the pad stack 34.

Figure 16:
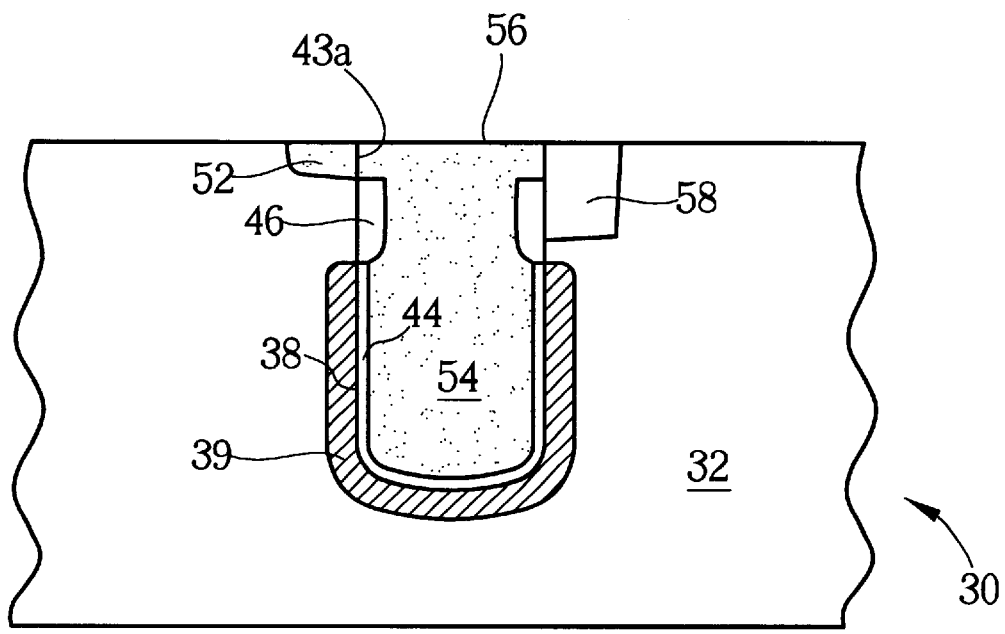

As shown in FIG. 16, a wet etch is performed using phosphoric acid ($H_3PO_4$) as the etching solution to completely remove the pad stack 34. Since the water-resistant and anti-oxidation properties of the undoped polysilicon layer 50 are better than that of the doped polysilicon layer 48, the undoped polysilicon layer 50 is used as a cap layer to protect the doped polysilicon layer 48 during the following cleaning process. A thermal diffusion is performed in a high-temperature environment, to diffuse dopants such as arsenic (As) of the doped polysilicon layer 48 into both the undoped polysilicon layer 50 and the upper region 43a and penetrating into the adjacent substrate 32. Next, a $N^+$ shallow junction 52 is formed within the substrate 32 and a storage node 54 is finally produced. During driving of the dopants into the substrate 32, the undoped polysilicon layer 50 is simultaneously doped by the diffusion of the dopants in the doped polysilicon layer 48. In another embodiment, the storage node 54 is electrically connected to a drain of a MOS transistor to form a data-transporting path. At the same time, the other side of the capacitor 56 is isolated from other elements by a shallow trench isolation (STI) 58 positioned nearby.

In contrast to the prior art, the method of fabricating the deep trench capacitor according to the present invention forms the collar oxide at the tops of the capacitor dielectric layer together with forming of the oxide layer in the capacitor dielectric layer. Hence, the present invention does not require the phase-in polysilicon filling process performed prior to and following the formation of the collar oxide layer, as in the prior art. In other words, the prior art requires three polysilicon deposition processes, three CMP planarization processes, and three polysilicon recess etching processes. However, only two polysilicon deposition processes, two CMP planarization processes, and two polysilicon recess etching processes are needed to fabricate a deep trench capacitor according to the present invention. The fabrication process of the deep trench is hence improved, whereby errors resulting from a complicated production process is minimized, while both production time and cost are reduced to increase production efficiency.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a deep trench capacitor in a DRAM cell comprising:
   providing a substrate, over which a patterned pad stack is positioned;
   etching the substrate using the patterned pad stack as a mask to form a deep trench within the substrate;
   forming a buried plate within the substrate underneath the deep trench;
   forming a dielectric layer on the surfaces of both the substrate and the deep trench;
   positioning a photoresist layer in the deep trench, aligning the surface of the photoresist layer with the tops of the buried plate;
   removing the dielectric layer uncovered by the photoresist layer to expose the area of the substrate in the upper region of the deep trench;
   removing the photoresist layer;
   performing an oxidation process to form a first oxide film on the dielectric layer and to form a second thicker oxide film on the exposed substrate in the deep trench;
   forming a doped polysilicon layer to cover the surface of the substrate as well as completely filling in the deep trench;
   performing a first planarization process, using the pad stack as a stop layer, to align the surface of the doped polysilicon layer within the deep trench with that of the pad stack;
   performing a first polysilicon recess etching process to etch back the doped polysilicon layer and lower the surface of the doped polysilicon layer down to the substrate;
   removing a portion of the second thicker oxide film to expose the area of the substrate in the upper region of the deep trench;
   forming an undoped polysilicon layer to cover the surface of the substrate as well as completely filling in the deep trench;
   performing a second planarization process, using the pad stack as a stop layer, to align the surface of the undoped polysilicon layer within the trench with that of the pad stack;
   performing a second polysilicon recess etching process to etch back the undoped polysilicon layer and lower the surface of the undoped polysilicon layer down to the pad stack, to form a storage node; and
   removing the pad stack.

2. The method of claim 1 wherein the substrate is a silicon substrate, a silicon-on-insulator (SOI) substrate or an epitaxy substrate.

3. The method of claim 1 wherein the pad stack is comprised of a silicon nitride layer and a pad oxide layer.

4. The method of claim 1 wherein the pad stack comprises an opening which penetrates through the pad stack to the substrate beneath and defines the position for a deep trench capacitor.

5. The method of claim 1 wherein the thickness of the second thicker oxide film is approximately 200 to 300 angstroms (Å).

6. The method of claim 1 wherein the dielectric layer is a silicon nitride layer.

7. The method of claim 6 wherein a capacitor dielectric layer is formed by the dielectric layer and the first oxide film to isolate the storage node from the buried plate.

8. The method of claim 1 wherein both the first and the second planarization processes belong to a chemical mechanical polishing (CMP) process.

9. The method of claim 1 wherein the buried plate is formed using an arsenic silicate glass (ASG) diffusion technology.

10. A method of fabricating a deep trench capacitor in a DRAM cell comprising:
    providing a substrate, over which a patterned pad stack is positioned;
    etching a deep trench patterned by the pad stack in the substrate;
    forming a buried plate within the substrate underneath the deep trench;
    forming a dielectric layer on the surfaces of both the substrate and the deep trench;
    positioning a photoresist layer in the deep trench, aligning the surface of the photoresist layer with the tops of the buried plate;
    removing the dielectric layer uncovered by the photoresist layer to expose the area of the substrate in the upper region of the deep trench;
    removing the photoresist layer;
    performing an oxidation process to form a first oxide film on the dielectric layer and to form a second thicker oxide film on the exposed substrate in the deep trench;
    performing a first polysilicon deposition-CMP-polysilicon recess etching process;
    removing a portion of the second thicker oxide film to expose the area of the substrate in the upper region of the deep trench;
    performing a second polysilicon deposition-CMP-polysilicon recess etching process to form a storage node; and
    removing the pad stack.

11. The method of claim 10 wherein the substrate is a silicon substrate, an SOI substrate or an epitaxy substrate.

12. The method of claim 10 wherein the pad stack comprises a silicon nitride layer.

13. The method of claim 10 wherein the thickness of the second thicker oxide film is approximately 200 to 300 angstroms (Å).

14. The method of claim 10 wherein the dielectric layer is a silicon nitride layer.

15. The method of claim 14 wherein a capacitor dielectric layer is formed by the dielectric layer and the first oxide film to isolate the storage node from the buried plate.

16. The method of claim 10 wherein the buried plate is formed using an ASG diffusion technology.

17. The method of claim 10 wherein the first polysilicon deposition-CMP-polysilicon recess etching process comprises the following steps:

forming a doped polysilicon layer to cover the surface of the substrate as well as completely filling in the deep trench;

performing a first CMP process, using the pad stack as a stop layer, to align the surface of the doped polysiliconlayer within the deep trench with that of the pad stack; and performing a first polysilicon recess etching process to etch back the doped polysilicon layer and lower the surface of the doped polysilicon layer down to the substrate.

18. The method of claim 10 wherein the second polysilicon deposition-CMP-polysilicon recess etching process comprises the following steps:

forming an undoped polysilicon layer to cover the surface of the substrate as well as completely filling in the deep trench;

performing a second CMP process, using the pad stack as a stop layer, to align the surface of the undoped polysilicon layer within the trench with that of the pad stack;

performing a second polysilicon recess etching process to etch back the undoped polysilicon layer and lower the surface of the undoped polysilicon layer down to the pad stack.

* * * * *